United States Patent [19]

Trinh et al.

[11] Patent Number: 4,858,717
[45] Date of Patent: Aug. 22, 1989

[54] ACOUSTIC CONVECTIVE SYSTEM

[75] Inventors: Eugene H. Trinh, Los Angeles, Calif.; Judith L. Robey, Arlington, Va.

[73] Assignee: The United States of America as represented by the Administrator of the National Aeronautics and Space Administration, Washington, D.C.

[21] Appl. No.: 172,100

[22] Filed: Mar. 23, 1988

[51] Int. Cl.[4] ............................................. G10K 11/00
[52] U.S. Cl. ...................... 181/0.5; 361/383; 361/384; 361/385; 62/467
[58] Field of Search ............... 181/0.5; 367/191, 151, 367/140; 60/325, 532; 62/467; 361/382, 383, 384, 385

[56] References Cited

U.S. PATENT DOCUMENTS

| | | | |
|---|---|---|---|
| 3,416,597 | 12/1968 | Kupferberg | 165/80 |
| 4,277,816 | 7/1981 | Dunn et al. | 361/384 |
| 4,393,437 | 7/1983 | Bell et al. | 361/384 |
| 4,393,708 | 7/1983 | Barmatz et al. | |
| 4,489,363 | 12/1984 | Goldberg | 361/383 |
| 4,498,118 | 2/1985 | Bell | |
| 4,536,824 | 8/1985 | Barrett et al. | 361/384 |
| 4,553,917 | 11/1985 | Lee | 219/121.65 |
| 4,672,848 | 6/1987 | Gohin et al. | |
| 4,688,199 | 8/1987 | Lock | 181/0.5 |
| 4,750,086 | 6/1988 | Mittal | 361/382 |

Primary Examiner—Deborah L. Kyle
Assistant Examiner—J. Woodrow Eldred
Attorney, Agent, or Firm—Thomas H. Jones; John R. Manning; Charles E. B. Glenn

[57] ABSTRACT

A small and simple system is provided for cooling or heating a small component by flowing air or other fluid over it, which does not require any macroscopic moving parts. The system includes a transducer and reflector that are spaced apart with the component between them, and with the transducer being operated at a frequency resonant to the spacing between it and the reflector. The resulting standing wave pattern produces acoustic streaming which results in the circulating of air or other fluid in the environment across the component. The system is especially useful in the reduced gravity environment of outer space because of the absence of any buoyancy-induced convection there.

12 Claims, 1 Drawing Sheet

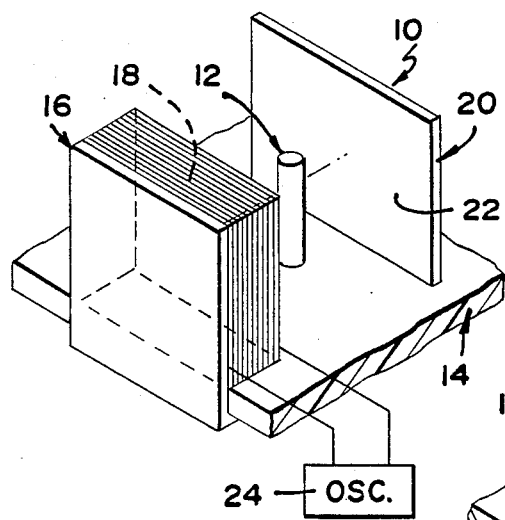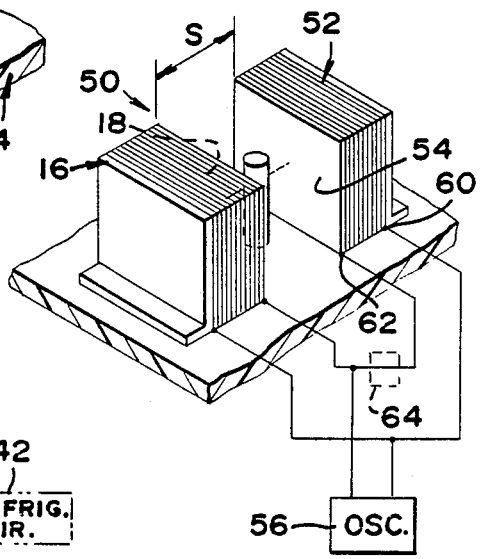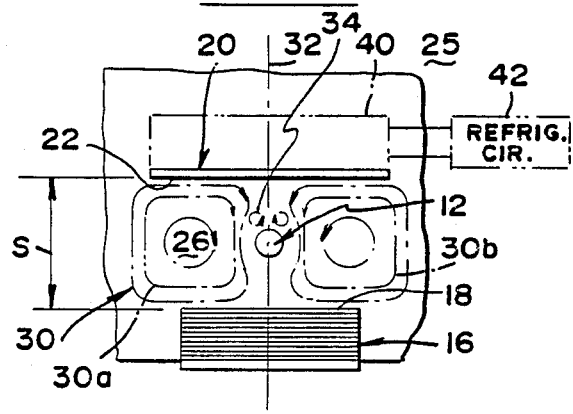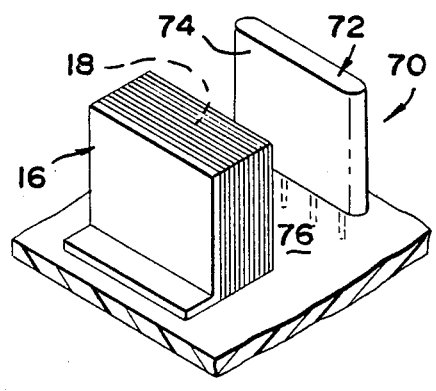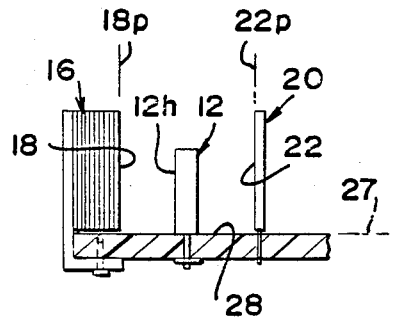

ACOUSTIC CONVECTIVE SYSTEM

ORIGIN OF THE INVENTION

The invention described herein was made in the performance of work under a NASA contract and is subject to the provisions of Public Law 96-517 (35 USC 202) in which the Contractor has elected not to retain the title.

BACKGROUND OF THE INVENTION

The cooling or heating of small electrical or mechanical components, is often accomplished by using flows of air or other fluid (gaseous or liquid) in the environment around the component. Natural convective currents occur in a gravity environment (on the Earth) due to the difference in densities of fluids at different temperatures, while fans are sometimes used for forced convection. In the reduced gravity environment of outer space, natural convection is minimal, leading to over heating (or under cooling) of components, and lower rates of drying or adsorption of samples. Fans can be used, but they have the disadvantage of causing low frequency vibrations that are difficult to damp, and cannot easily be used in very small volumes. One example of a situation where localized cooling is required, is in the enhanced cooling of one or only a few components of an electronic circuit board. A small device for creating convective current can save weight, space, and energy requirements in cooling components and in other applications.

SUMMARY OF THE INVENTION

In accordance with one embodiment of the present invention, a simple system is provided for controlling the temperature of a component lying in a fluid environment. The system includes a sound transducer spaced from the component and having a transducer surface facing the component. A sonic reflecting surface is spaced from the transducer surface at least as far as the component. The transducer is driven to direct sound at the reflecting surface, with the sound having a wavelength that produces a high intensity standing wave pattern in the space between the surfaces. The high intensity standing wave pattern results in acoustic streaming, which is the movement of air between the surfaces, to provide convective cooling for the component. The reflecting surface can be a separate reflector positioned with the component between the reflector and transducer, or the reflecting surface can be a surface on the component.

A separate reflector can be cooled or heated, to cool or heat air passing by it which then flows to the component. A separate reflector can be formed by a second transducer driven in synchronism with the first transducer, but with a generally 0° or 180° phase difference, depending upon the resonant mode of the standing wave pattern. The creation of convection currents is useful in applications other than heating and cooling, as in enhancing adsorption or desorption from a sample.

The novel features of the invention are set forth with particularity in the appended claims. The invention will be best understood from the following description when read in conjunction with the accompanying drawings.

BRIEF DESCRIPTION OF THE DRAWINGS

FIG. 1 is a perspective view of a temperature controlling system constructed in accordance with one embodiment of the present invention.

FIG. 2 is a plan view of the system of FIG. 1.

FIG. 3 is a sectional side view of the system of FIG. 1.

FIG. 4 is a perspective view of a temperature control system constructed in accordance with another embodiment of the invention, wherein two synchronized transducers are employed.

FIG. 5 is a perspective view of a control system constructed in accordance with another embodiment of the invention, wherein a standing wave pattern is established between a transducer and a component.

DESCRIPTION OF THE PREFERRED EMBODIMENTS

FIG. 1 illustrates a system 10 for cooling an electronic circuit component 12 which is a part of an electronic circuit board device 14 which includes a board and various electronic circuit components, and wherein the component 12 requires more cooling than most of the board device. For example, the component can be a high density integrated circuit which consumes considerable power in a small space and whose temperature must not be allowed to rise more than a limited amount above ambient temperature. The system includes a sound transducer 16 mounted on the circuit board device and spaced from the component and having a transducer surface 18 generally facing the component. A reflector 20 is spaced from the transducer surface in generally the same direction as the component. The reflector includes a sonic reflecting surface 22 facing the transducer surface. An oscillator 24 drives the transducer to vibrate its surface 18 towards and away from the reflecting surface 22.

The frequency of the oscillator 24 is chosen so the wavelength of sonic energy is resonant to the spacing S (FIG. 2) between the surfaces 18, 22. This results in the creation of an acoustic standing wave pattern in the fluid medium such as air 25 lying in the space 26 between the surfaces, and the creation of acoustic streaming, or convective air flows in this space. FIG. 2 shows a pattern 30 of air flows, the air flowing in two vortexes 30a, 30b. The vortexes create air flows along each of the surfaces 18, 22 towards a center plane 32, generally along or near the center plane 32 across the space from one surface to the other, away from the center plane along the other surface, and then again across the space 26. A secondary set of vortexes 34 forms around the sample. By placing the component 12 near the center plane 32 that bisects the surfaces 18, 22 the component is placed in a region of the highest velocity of air flow.

In order to establish an acoustic standing wave pattern in the space 26 between the transducer and reflecting surfaces, the wavelength L of acoustic waves is chosen so that the spacing S between the surfaces is substantially equal to nL/2, where n is an integer. For a spacing S of 1.2 cm between the surfaces in air at room temperature and pressure, where the velocity of air is about 340 meters per second, a frequency of about 15 KHz is the lowest resonant frequency or resonant mode. Higher resonant modes such as about 30 KHz or 45 KHz are also effective in generating convective flow.

The cooling system is especially useful in outer space vehicles, where the very low gravity results in almost no natural convective flow. In space vehicles, the low frequency vibrations of a cooling fan or blower would be deleterious because it is difficult to damp such low frequencies to prevent them from affecting delicate instruments on the spacecraft. Where the component to be cooled is small, the transducer and reflector can also be of very small size, to minimize the required weight, size, and power consumption of the cooling system.

In FIGS. 1-3, the cooling system includes only two flat (or slightly curved) surfaces 18, 22 that face each other. The component 12 has a heated portion 12h (FIG. 3) lying above (on one side of) the plane 27 of the circuit board upper wall surface 28, and the transducer and reflecting surfaces lie in parallel planes 18p, 22p extending perpendicular to the wall surface plane. It should be realized that a variety of acoustic modes can be established, using curved surfaces, and with more than two walls, although there is generally no need to resort to such complex acoustic systems. In any of such systems, the obtaining of substantial acoustic streaming, or convective flow, requires the production of an acoustic standing-wave pattern by driving a transducer at a frequency which is resonant to the system.

Additional cooling of the component 12 can be obtained by cooling one of the surfaces 18, 22 to a temperature below ambient temperature. FIG. 2 illustrates such a cooling arrangement, which includes an electronic cooling module 40 energized by a refrigeration circuit 42. The cooling module 40 is coupled to the reflector 20 to cool it, so that air passing along the reflector surface 22 is cooled before leaving the surface to pass across the component. While it is sometimes possible to couple a cooling system such as the module 40 directly to the component 12, it is often desirable to provide a space between them to avoid the possibility of short circuiting. The coupling through convective air currents provides cooling from a distance.

While air is the most common fluid or medium in the environment, the use of sonically generated convective currents can be employed in a wide variety of fluids, including liquids as well as a variety of gases. There are some applications where it is desirable to heat a cooled component. The same system can be used, with enhanced heating obtained by heating the reflector 20. It is possible to cool or heat the transducer 16 and/or the reflector 20.

FIG. 4 illustrates another system 50 where the reflector is in the form of a second transducer 52 with a surface 54 facing the first transducer surface 18. A driving circuit or oscillator 56 is coupled to both of the acoustic transducers 16, 52 to drive them in synchronism. Where the spacing S between transducers equals one half of the wavelength of the sound, or an odd multiple thereof, the two transducers are driven at a phase difference of about 180° (so as the surface 18 is moving towards the component, the surface 54 of the other transducer is moving away from it). Such 180° phase shift can be accomplished through proper connection of the terminals 60, 62 of one of the transducers relative to the terminals of the other, or by introducing a 180° phase shift subcircuit 64. For a spacing S equal to an even multiple of the wavelength, the transducers can be driven at substantially the same phase. The use of two transducers results in a more intense standing wave pattern and more rapid air or other fluid flow past the component.

FIG. 5 illustrates a system 70 where the component 72 to be cooled or heated (or dried, etc.) has a surface 74 of sufficient extent to serve as an acoustic surface for the acoustic reflective flow of air. The transducer 16 is positioned so its transducer surface 18 faces the component surface 74. In this case, the component surface 74 is cooled by the flow of air along it before the air is diverted through the space 76 between the two surfaces.

Applicant has constructed and tested a system of the type shown in FIGS. 1-3, to cool a thermistor at various temperatures between about 100° C. and 600° C. A substantial drop is thermistor temperature was recorded with the sound on, as compared to when the sound was off.

The temperature control systems of the present invention are useful not only with electronic and mechanical components to be cooled or heated, but also to produce convective flow across samples for other purposes. For example, the convective flow can enhance out gasing or absorption of solvents in liquid-gas, solid-gas, and liquid-liquid systems. The system is also useful in heating and cooling such samples.

Thus, the invention provides a method and apparatus for producing enhanced convective flow across a component, so as to cool the component, heat it, or produce convective flow for other purposes. The system includes an acoustic transducer with a surface generally facing the component, and means forming a reflective surface at least as far from the transducer surface as the component. The transducer is driven at a frequency which produces a standing wave pattern in the space between the surfaces, to produce acoustic streaming, or fluid flow in that space. The reflecting surface can be the surface of a separate reflector placed so the component lies between the transducer and reflecting surfaces. Where the component has an appropriate surface, it can be used as the reflecting surface. Either the transducer surface or the reflecting surface of a separate reflector can be cooled or heated to enhance convective cooling or heating. Two transducers driven in synchronism can be used to enhance convective cooling of a component between them.

Although particular embodiments of the invention have been described and illustrated herein, it is recognized that modifications and variations may readily occur to those skilled in the art and consequently it is intended to cover such modifications and equivalents.

What is claimed is:

1. Apparatus for cooling an electronic circuit component by producing a convective flow of fluid past the component while it lies in an environment of said fluid comprising:
   a sound transducer spaced from said circuit component and having a transducer surface generally facing in a predetermined direction toward said component;
   means forming a sonic reflecting surface spaced generally in said predetermined direction from said transducer, at least as far as said component;
   means for driving said transducer at a frequency which produces an acoustic standing wave pattern in the space between said surfaces.

2. The apparatus described in claim 1 including:
   a circuit board, said circuit component lying on said circuit board and said transducer and said means forming a reflecting surface lying on said circuit board on opposite sides of said circuit component.

3. The apparatus described in claim 1 wherein:
said means forming a sonic reflecting surface comprises a reflector spaced further from said transducer surface than said component, said component lying between said transducer surface and said sonic reflecting surface; and
means for cooling said reflector below the temperature of said fluid.

4. The apparatus described in claim 1 including:
means for cooling said transducer surface below the temperature of said fluid.

5. The apparatus described in claim 1 wherein:
said circuit component has a surface that forms said sonic reflecting surface, and substantially all of the energy of said acoustic standing wave pattern lies in the space between said circuit component and said transducer.

6. The apparatus described in claim 1 wherein:
said means forming a sonic reflecting surface comprises a second sound transducer spaced further from said first named transducer than said component, with said component lying between said transducers;
said spacing between said transducers is substantially equal to nL/2, where L is the wavelength of sound in said fluid at said frequency and n is an integer.
said driving means energizes said second transducer in synchronism with said first transducer, with a phase difference between them equal to substantially 180° where n is odd and equal to substantially 0° where n is even.

7. Apparatus for cooling a heated electronic component which is part of a circuit board device lying in a fluid environment comprising:
a sonic transducer mounted on said circuit board device and spaced from said component and having a transducer surface;
means mounted on said circuit board device forming a reflector surface lying on a side of said component opposite said transducer;
means for energizing said transducer at a frequency which is resonant to the spacing between said surfaces to establish a standing wave pattern in the space between said surfaces.

8. The apparatus described in claim 7 wherein:
said circuit board device has a board with a board surface lying substantially in a first plane, said component having a heated portion lying above said plane;
said transducer and reflecting surfaces lie in substantially parallel second and third planes perpendicular to said first plane.

9. A method for producing convective flow of a fluid past a circuit component of a circuit device lying in a fluid medium comprising:
establishing a transducer having a transducer surface and a reflector having a reflective surface, at a predetermined spacing distance with said surfaces facing each other, and with said surfaces on opposite sides of said circuit component;
energizing said transducer to produce sound waves of a wavelength resonant to said spacing distance.

10. The method described in claim 9 including:
means for cooling one of said surfaces to a temperature below ambient fluid medium temperature.

11. The method described in claim 9 including:
vibrating said reflective surface in synchronism with said transducer and at a relative phase which increases the intensity of acoustic energy in the space between said surfaces.

12. A method for establishing a convective flow of fluid across a circuit component of a circuit device which has a sonic reflecting surface, comprising:
establishing a sonic transducer having a transducer surface, at a predetermined spacing from said component reflecting surface with said transducer surface facing said reflecting surface;
producing an acoustic standing wave pattern whose acoustic energy lies substantially solely between said transducer and said circuit component, including energizing said transducer to vibrate said transducer surface at a frequency which produces sound waves of a wavelength substantially resonant to said spacing.

* * * * *